(12) United States Patent
Yong

(10) Patent No.: US 11,852,926 B2
(45) Date of Patent: Dec. 26, 2023

(54) ARRAY SUBSTRATE, MANUFACTURING METHOD THEREOF, AND LCD PANEL

(71) Applicant: TCL CHINA STAR OPTOELECTRONICS TECHNOLOGY CO., LTD., Guangdong (CN)

(72) Inventor: Weina Yong, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 884 days.

(21) Appl. No.: 16/758,199

(22) PCT Filed: Apr. 3, 2020

(86) PCT No.: PCT/CN2020/083098
§ 371 (c)(1),
(2) Date: Apr. 22, 2020

(87) PCT Pub. No.: WO2021/179373
PCT Pub. Date: Sep. 16, 2021

(65) Prior Publication Data
US 2023/0122418 A1 Apr. 20, 2023

(30) Foreign Application Priority Data
Mar. 12, 2020 (CN) .......................... 202010170962.7

(51) Int. Cl.
*G02F 1/1343* (2006.01)
*G02F 1/1335* (2006.01)
(Continued)

(52) U.S. Cl.
CPC .. *G02F 1/134309* (2013.01); *G02F 1/133512* (2013.01); *G09G 3/36* (2013.01); *H01L 27/1218* (2013.01); *G09G 2320/028* (2013.01)

(58) Field of Classification Search
None
See application file for complete search history.

(56) References Cited

U.S. PATENT DOCUMENTS 5,844,644 A * 12/1998 Oh ..................... G02F 1/134363
349/95
11,257,449 B2 * 2/2022 He ....................... G09G 3/3611
(Continued)

FOREIGN PATENT DOCUMENTS

| CN | 103163575 A | 6/2013 |
|---|---|---|
| CN | 104503169 A | 4/2015 |

(Continued)

*Primary Examiner* — Ryan Crockett
(74) *Attorney, Agent, or Firm* — PV IP PC; Wei Te Chung; Zhigang Ma

(57) ABSTRACT

The disclosure provides an array substrate, a manufacturing method thereof, and a liquid crystal display (LCD) panel. The array substrate includes a substrate, a driving circuit layer, a pixel electrode layer, and an astigmatism layer, which are stacked. The pixel electrode layer includes a plurality of pixel electrodes which are independent from each other. The astigmatism layer includes a plurality of astigmatism components which are connected to each other and correspond to the pixel electrodes. An area of a light-emitting surface of the astigmatism components away from the pixel electrodes is greater than an area of an electrode surface of the pixel electrodes away from the substrate. The disclosure improves viewing angles.

20 Claims, 8 Drawing Sheets

(51) Int. Cl.
*G09G 3/36* (2006.01)
*H01L 27/12* (2006.01)

(56) References Cited

U.S. PATENT DOCUMENTS

| | | | | |
|---|---|---|---|---|
| 2003/0081153 | A1* | 5/2003 | Kobayashi | G02F 1/133512 349/95 |
| 2005/0111100 | A1* | 5/2005 | Mather | H04N 13/359 359/464 |
| 2012/0075540 | A1* | 3/2012 | Chen | G02B 30/27 359/256 |
| 2015/0269893 | A1* | 9/2015 | Wu | H04N 13/312 345/419 |
| 2016/0109752 | A1* | 4/2016 | Tateno | G02B 3/0068 349/110 |
| 2018/0173048 | A1* | 6/2018 | Ito | G02F 1/1368 |
| 2018/0210218 | A1* | 7/2018 | Wei | G02F 1/29 |
| 2018/0252932 | A1* | 9/2018 | Tan | G02F 1/134309 |
| 2018/0314087 | A1* | 11/2018 | Ito | G02F 1/133524 |
| 2019/0033642 | A1* | 1/2019 | Haruyama | G09G 3/3677 |
| 2019/0064584 | A1* | 2/2019 | Ito | G02F 1/136227 |
| 2020/0033515 | A1* | 1/2020 | Li | G02B 5/201 |
| 2021/0312877 | A1* | 10/2021 | He | G09G 3/3208 |

FOREIGN PATENT DOCUMENTS

| | | |
|---|---|---|
| CN | 105185811 A | 12/2015 |
| CN | 105700261 A | 6/2016 |
| CN | 106200173 A | 12/2016 |
| CN | 110429200 A | 11/2019 |
| JP | H06230358 A | 8/1994 |
| JP | 2000314887 A | 11/2000 |
| JP | 2008065249 A | 3/2008 |

* cited by examiner

ARRAY SUBSTRATE, MANUFACTURING METHOD THEREOF, AND LCD PANEL

FIELD

The present disclosure relates to the field of display technologies, and more particularly, relates to an array substrate, a manufacturing method thereof, and a liquid crystal display (LCD) panel.

BACKGROUND

In the field of display, with introduction of high-end devices, customers' demands for panels having wide viewing angles have become increasingly high. Pixel electrodes of vertical alignment (VA) LCD panels are planar. Due to properties of the VA-LCD panels, a viewer watching a panel from a wide angle may have a significantly poor viewing experience compared to a viewer watching in front of the panel. In pixel electrodes of conventional VA-LCD panels, a multi-domain design has replaced a single-domain design to satisfy demands for viewing angles. To get better viewing angles, brightness of some pixel electrodes is reduced if a panel has a four-domain design, and brightness of all electrodes is reduced if a panel has an eight-domain design. However, both the above two methods sacrifice light transmittance of grayscales, and therefore cannot satisfy customers' requirements.

Consequently, it is necessary to solve a technical problem of poor viewing angles of LCD panels.

SUMMARY

The present disclosure provides an array substrate, a manufacturing method thereof, and an LCD panel to solve a technical problem of poor viewing angles of LCD panels.

To solve the above problem, technical solutions provided by the present disclosure are described as follows.

The present disclosure provides an array substrate, including: a substrate; a driving circuit layer disposed on a side of the substrate; a pixel electrode layer disposed on a side of the driving circuit layer away from the substrate, wherein the pixel electrode layer includes a plurality of pixel electrodes which are distributed in an array manner and independent from each other, and the pixel electrodes include an electrode surface away from the substrate; and an astigmatism layer disposed on a side of the pixel electrode layer away from the driving circuit layer, wherein the astigmatism layer includes a plurality of astigmatism components which are distributed in the array manner and connected to each other, the astigmatism components correspond to the pixel electrodes and include a light-emitting surface away from the pixel electrodes, and an area of the light-emitting surface is greater than an area of the electrode surface.

In the array substrate of the present disclosure, the astigmatism layer is made of a transparent material.

In the array substrate of the present disclosure, the transparent material is a positive photoresist or a negative photoresist.

In the array substrate of the present disclosure, the light-emitting surface is convex.

In the array substrate of the present disclosure, the light-emitting surface is concave.

In the array substrate of the present disclosure, the pixel electrodes have a planar structure or a slit structure.

In the array substrate of the present disclosure, the pixel electrodes have a planar surface.

The present disclosure further provides a method of manufacturing an array substrate, including following steps:
providing a substrate;
forming a driving circuit layer on a side of the substrate;
forming a pixel electrode layer on a side of the driving circuit layer away from the substrate, wherein the pixel electrode layer includes a plurality of pixel electrodes which are distributed in the array manner and independent from each other, and the pixel electrodes include an electrode surface away from the substrate; and
forming an astigmatism layer on a side of the pixel electrode layer away from the driving circuit layer, wherein the astigmatism includes a plurality of astigmatism components which are distributed in the array manner and connected to each other, the astigmatism components correspond to the pixel electrode and include a light-emitting surface away from the pixel electrodes, and an area of the light-emitting surface is greater than an area of the electrode surface.

In the method of the present disclosure, the step of forming the astigmatism layer on the side of the pixel electrode layer away from the driving circuit layer, wherein the astigmatism includes the plurality of astigmatism components which are distributed in the array manner and connected to each other, the astigmatism components correspond to the pixel electrode and include the light-emitting surface away from the pixel electrodes, and the area of the light-emitting surface is greater than the area of the electrode surface, includes following steps:
coating a positive photoresist on the side of the pixel electrode layer away from the driving circuit layer;
exposing the positive photoresist by using a mask plate, wherein the mask plate includes a light shielding area and a light transmittance area, the light shielding area corresponds to the pixel electrodes, and the light transmittance area corresponds to an area between adjacent pixel electrodes;
developing the positive photoresist to remove the positive photoresist corresponding to the light transmittance area; and
heating the positive photoresist to form the plurality of astigmatism components which are distributed in the array manner and connected to each other, wherein the astigmatism components correspond to the pixel electrodes, and the light-emitting surface of the astigmatism components away from the pixel electrodes is convex.

In the method of the present disclosure, the step of forming the astigmatism layer on the side of the pixel electrode layer away from the driving circuit layer, wherein the astigmatism includes the plurality of astigmatism components which are distributed in the array manner and connected to each other, the astigmatism components correspond to the pixel electrode and include the light-emitting surface away from the pixel electrodes, and the area of the light-emitting surface is greater than the area of the electrode surface, includes following steps:
coating a positive photoresist on the side of the pixel electrode layer away from the driving circuit layer;
exposing the positive photoresist by using a mask plate, wherein the mask plate includes a light shielding area and a light transmittance area, the light transmittance area corresponds to a portion of the pixel electrodes, the portion of the pixel electrodes includes a first area, a second area, and a third area which are independent from each other, the first area corresponds to a middle area of the pixel electrodes, the second area and the third area are respectively disposed at two sides of the first area, and the light shielding area corresponds to another portion of the pixel electrodes and an area between adjacent pixel electrodes;

developing the positive photoresist to remove the positive photoresist corresponding to the light transmittance area; and heating the positive photoresist to form the plurality of astigmatism components which are distributed in the array manner and connected to each other, wherein the astigmatism components correspond to the pixel electrodes, and the light-emitting surface of the astigmatism components away from the pixel electrodes is concave.

In the method of the present disclosure, the step of forming the astigmatism layer on the side of the pixel electrode layer away from the driving circuit layer, wherein the astigmatism includes the plurality of astigmatism components which are distributed in the array manner and connected to each other, the astigmatism components correspond to the pixel electrode and include the light-emitting surface away from the pixel electrodes, and the area of the light-emitting surface is greater than the area of the electrode surface, includes following steps:

coating a negative photoresist on a side of the pixel electrode layer away from the driving circuit layer;

exposing the negative photoresist by using a mask plate, wherein the mask plate includes a light shielding area and a light transmittance area, the light shielding area corresponds to an area between adjacent pixel electrodes, and the light transmittance area corresponds to the pixel electrodes;

developing the negative photoresist to remove the negative photoresist corresponding to the light shielding area; and heating the negative photoresist to form the plurality of astigmatism components which are distributed in the array manner and connected to each other, wherein the astigmatism components correspond to the pixel electrodes, and the light-emitting surface of the astigmatism components away from the pixel electrodes is convex.

In the method of the present disclosure, the step of forming the astigmatism layer on the side of the pixel electrode layer away from the driving circuit layer, wherein the astigmatism includes the plurality of astigmatism components which are distributed in the array manner and connected to each other, the astigmatism components correspond to the pixel electrode and include the light-emitting surface away from the pixel electrodes, and the area of the light-emitting surface is greater than the area of the electrode surface, includes following steps:

coating a negative photoresist on a side of the pixel electrode layer away from the driving circuit layer;

exposing the negative photoresist by using a mask plate, wherein the mask plate includes a light shielding area and a light transmittance area, the light shielding area corresponds to a portion of the pixel electrodes, the portion of the pixel electrodes includes a first area, a second area, and a third area which are independent from each other, the first area corresponds to a middle area of the pixel electrodes, the second area and the third area are respectively disposed at two sides of the first area, and the light transmittance area corresponds to another portion of the pixel electrodes and an area between adjacent pixel electrodes;

developing the negative photoresist to remove the negative photoresist corresponding to the light shielding area; and heating the negative photoresist to form the plurality of astigmatism components which are distributed in the array manner and connected to each other, wherein the astigmatism components correspond to the pixel electrodes, and the light-emitting surface of the astigmatism components away from the pixel electrodes is concave.

In the method of the present disclosure, the step of forming the pixel electrode layer on the side of the driving circuit layer away from the substrate, wherein the pixel electrode layer includes the plurality of pixel electrodes which are distributed in the array manner and independent from each other, and the pixel electrodes include an electrode surface away from the substrate, includes a following step: forming the pixel electrode layer on the side of the driving circuit layer away from the substrate, wherein the pixel electrode layer includes a plurality of pixel electrodes which are distributed in the array manner and independent from each other, and the pixel electrodes have a planar structure or a slit structure.

The present disclosure further provides an LCD panel, including a first substrate and a second substrate, which form a cell, and a liquid crystal layer disposed between the first substrate and the second substrate, wherein the first substrate includes: a substrate; a driving circuit layer disposed on a side of the substrate; a pixel electrode layer disposed on a side of the driving circuit layer away from the substrate, wherein the pixel electrode layer includes a plurality of pixel electrodes which are distributed in the array manner and independent from each other, and the pixel electrodes include an electrode surface away from the substrate; and an astigmatism layer disposed on a side of the pixel electrode layer away from the driving circuit layer, wherein the astigmatism layer includes a plurality of astigmatism components which are distributed in the array manner and connected to each other, the astigmatism components correspond to the pixel electrodes and include a light-emitting surface away from the pixel electrodes, and an area of the light-emitting surface is greater than an area of the electrode surface.

In the LCD panel of the present disclosure, the astigmatism layer is made of a transparent material.

In the LCD panel of the present disclosure, the transparent material is a positive photoresist or a negative photoresist.

In the LCD panel of the present disclosure, the light-emitting surface is convex.

In the LCD panel of the present disclosure, the light-emitting surface is concave.

In the LCD panel of the present disclosure, the pixel electrodes have a planar structure or a slit structure.

In the LCD panel of the present disclosure, the pixel electrodes have a planar surface.

Regarding the beneficial effects: the present disclosure provides an array substrate, a manufacturing method thereof, and an LCD panel. The array substrate includes a substrate, a driving circuit layer, a pixel electrode layer, and an astigmatism layer. The driving circuit layer is disposed on a side of the substrate. The pixel electrode layer is disposed on a side of the driving circuit layer away from the substrate and includes a plurality of pixel electrodes which are distributed in the array manner and independent from each other. The pixel electrodes include an electrode surface away from the substrate. The astigmatism layer is disposed on a side of the pixel electrode layer away from the driving circuit layer and includes a plurality of astigmatism components which are distributed in the array manner and connected to each other. The astigmatism components correspond to the pixel electrodes and include a light-emitting surface away from the pixel electrodes. An area of the light-emitting surface is greater than an area of the electrode surface. By forming the astigmatism layer on the pixel electrodes and making the area of the light-emitting surface of the astigmatism layer greater than the area of the electrode surface of the pixel electrodes, light emitted from a backlight module will be refracted at light-emitting surface of the astigmatism layer after the LCD panel is formed. As a result, light-emitting angles and viewing angles are increased.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
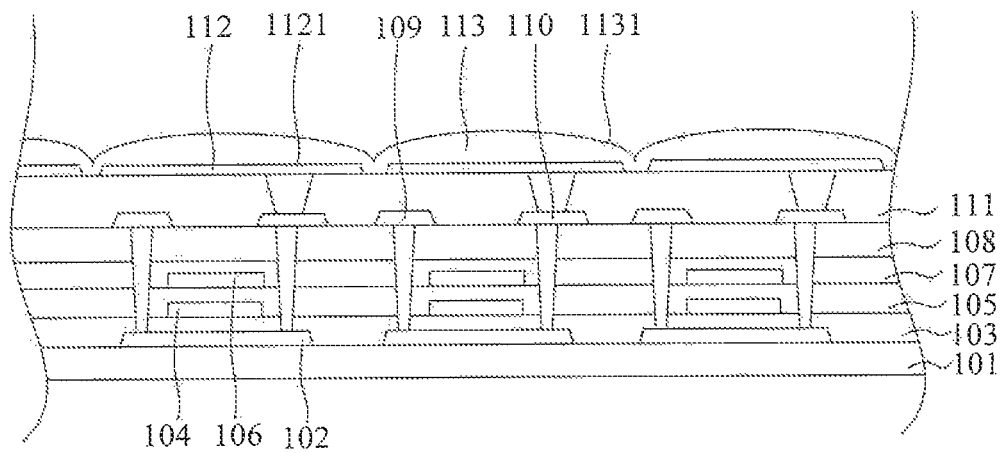
FIG. 1 is a first schematic structural view showing an array substrate provided by an embodiment of the present disclosure.

The following description of the various embodiments is provided with reference to the accompanying drawings to demonstrate that the embodiments of the present disclosure may be implemented. It should be understood that terms such as "upper", "lower", "front", "rear", "left" ,"right", "inside", "outside", "lateral", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

As shown in FIG. 1 a first schematic structural view showing an array substrate according to an embodiment of the present disclosure is provided. The array substrate includes a substrate 101, a driving circuit layer, a pixel electrode layer, and an astigmatism layer. The driving circuit layer is disposed on a side of the substrate 101. The pixel electrode layer is disposed on a side of the driving circuit layer away from the substrate 101 and includes a plurality of pixel electrodes 112 which are distributed in an array manner and independent from each other. The pixel electrodes 112 include an electrode surface 1121 away from the substrate 101. The astigmatism layer is disposed on a side of the pixel electrode layer away from the driving circuit layer and includes a plurality of astigmatism components 113 which are distributed in the array manner and connected to each other. The astigmatism components 113 correspond to the pixel electrodes 112 and include a light-emitting surface 1131 away from the pixel electrodes 112. An area of the light-emitting surface 1131 is greater than an area of the electrode surface 1121.

The substrate 101 may be a rigid substrate made of glass or a transparent resin, or may be a flexible substrate made of polyimide, polycarbonate, polyethersulfone, polyethylene terephthalate, polyethylene naphthalate, polyacrylates, or glass fiber reinforced plastics. A material of the substrate 101 is not limited here.

The driving circuit layer is disposed on a side of the substrate 101 and includes a plurality of thin film transistors (TFTs). Take a top-gate TFT as an example, it includes an active layer 102, a first gate insulating layer 103, a first metal layer 104, a second gate insulating layer 105, a second metal layer 106, an interlayer dielectric layer 107, a planarization layer 108, a source/drain layer, and a passivation layer 111, which are stacked on the substrate 101.

Generally, a buffer layer (not shown) is also disposed on the substrate 101, and a material of the buffer layer may be an inorganic material such as silicon oxide and silicon nitride.

The active layer 102 is disposed on the buffer layer. A material of the active layer 102 may be a metal oxide such as indium gallium zinc oxide (IGZO), but is not limited thereto. The material of the active layer 102 may also be one or more of aluminum zinc oxide (AZO), indium zinc oxide (IZO), zinc oxide (ZnO), indium oxide ($In_2O_3$), boron doped zinc oxide (BZO), and magnesium doped zinc oxide (MZO). In addition, the active layer may also be made of polysilicon or other materials.

The first gate insulating layer 103 is disposed on the active layer, and a material of the first gate insulating layer 103 may be an inorganic material such as silicon oxide or silicon nitride.

The first metal layer 104 is disposed on the first gate insulating layer 103. A material of the first metal layer 104 may be Mo, Al, or Cu, but is not limited thereto. The material of the first metal layer 104 may also be Cr, W, Ti, Ta, or alloys thereof, and is not limited here. A gate of the TFTs and a first electrode plate of storage capacitors are formed by etching patterns defined on the first metal layer 104.

A second gate insulating layer 105 is disposed on the first metal layer 104, and a material of the second insulating layer 105 may be an inorganic material such as silicon oxide or silicon nitride.

A second metal layer 106 is disposed on the second gate insulating layer 105, and a material of the second metal layer 106 may be Mo, Al, or Cu, but is not limited thereto. The material of the second metal layer 106 may also be Cr, W, Ti, Ta, or alloys thereof, and is not limited here. A second electrode plate of the storage capacitors is formed by etching patterns defined on the second metal layer 106.

An interlayer dielectric layer 107 is disposed on the second metal layer 106, and a material of the interlayer dielectric layer 107 may be an inorganic material such as silicon oxide or silicon nitride.

A passivation layer 108 is disposed on the interlayer dielectric layer 107, and a material of the passivation layer 108 may be at least one of silicon oxide or silicon nitride.

A source/drain layer is disposed on the passivation layer 108, and a material of the source/drain layer may be Mo, Al, or Cu, but is not limited thereto. The material of the source/drain layer may also be Cr, W, Ti, Ta, or alloys thereof. A source 109 and a drain 110 of the TFTs are formed by etching patterns defined on the source/drain layer. The source 109 and the drain 110 are connected to the active layer 102 by a first through hole.

A planarization layer 111 is disposed on the source/drain layer by coating, and a material of the planarization layer 111 may be a photoresist.

The above descriptions regarding layer structures are based on a top-gate TFT in the driving circuit layer. Of course, a structure of the driving circuit layer is not limited thereto. The driving circuit layer may further include a bottom-gate TFT.

A pixel electrode layer is disposed on the driving circuit layer and includes a plurality of pixel electrodes 112 which are arranged in the array manner and independent from each other, and the pixel electrodes 112 are connected to the drain 110 of the TFTs by a second through hole. The pixel electrodes 112 include an electrode surface 1121 away from the substrate 101, and the electrode surface 1121 is a planar surface.

An astigmatism layer is disposed on the pixel electrode layer and includes a plurality of astigmatism components 113 which are arranged in the array manner and connected to each other. The astigmatism components 113 correspond to the pixel electrodes 112, adjacent astigmatism components 113 are connected to each other, and locations where the astigmatism components 113 are connected to each other correspond to locations between adjacent the pixel electrodes 112. The astigmatism components 113 include a light-emitting surface 1131 away from the pixel electrodes 112. After an array substrate and a color filter substrate form an LCD panel which is bonded to a backlight module, light emitted from the backlight module passes through the pixel electrodes and the astigmatism layer, and exits from the light-emitting surface 1131 of each of the astigmatism components 113.

Incident light emitted from the backlight module is parallel light. An area of the light-emitting surface 1131 of the astigmatism components 113 is greater than an area of the electrode surface 1121 of the pixel electrodes 112, that is, the light-emitting surface 1131 is not a planar surface. Therefore, incident light is refracted in a spreading direction at the light-emitting surface 1131. As a result, a light-emitting angle is increased, and brightness and chromaticity of the panel can be effectively improved wherever it is watched from.

To ensure as much as incident light can be emitted, a material of the astigmatism layer may be a transparent material such as a positive photoresist or a negative photoresist.

There are multiple ways to make the area of the light-emitting surface 1131 of the astigmatism components 113 greater than the area of the electrode surface 1121 of the pixel electrodes 112. In one embodiment, as shown in FIG. 1, the light-emitting surface 1131 is convex, and the astigmatism components 113 form a transparent convex lens. According to a diagram showing a principle of light transmission, incident light is refracted at the light-emitting surface 1131. Incident light at a left side of a middle portion of the astigmatism components 113 is refracted to the right, incident light at a right side of the middle portion of the astigmatism components 113 is refracted to the left, and incident light at the middle portion of the astigmatism components 113 is straightly emitted. Before the astigmatism layer is disposed, incident light can only be emitted in a direction perpendicular to the electrode surface 1121, leading to narrow viewing angles. However, the convex light-emitting surface 1131 may change a light-emitting direction, thereby increasing light-emitting angles and viewing angles. Therefore, viewers may have good viewing experience even though they watch the panel from the side.

Figure 2:
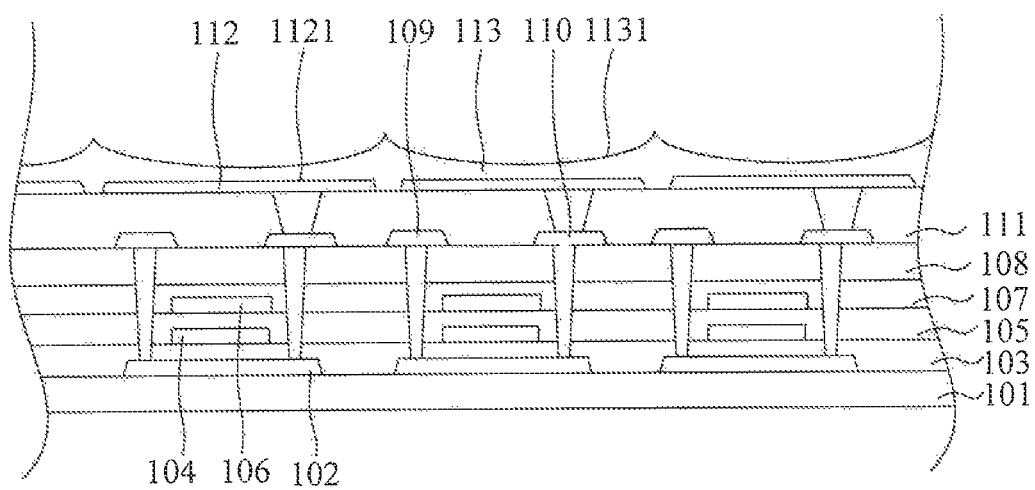
FIG. 2 is a second schematic structural view showing an array substrate provided by the embodiment of the present disclosure.

In one embodiment, as shown in FIG. 2, the light-emitting surface 1131 is concave, and the astigmatism components 113 form a transparent concave lens. According to a diagram showing a principle of light transmission, incident light is refracted at the light-emitting surface 1131. Incident light at a left side of a middle portion of the astigmatism components 113 is refracted to the left, incident light at a right side of the middle portion of the astigmatism components 113 is refracted to the right, and incident light at the middle portion of the astigmatism components 113 is straightly emitted. Before the astigmatism layer is disposed, incident light can only be emitted in a direction perpendicular to the electrode surface 1121, leading to narrow viewing angles. However, the concave light-emitting surface 1131 may change a light-emitting direction, thereby increasing light-emitting angles and viewing angles. Therefore, viewers may have good viewing experience even though they watch the panel from the side.

Figure 3:
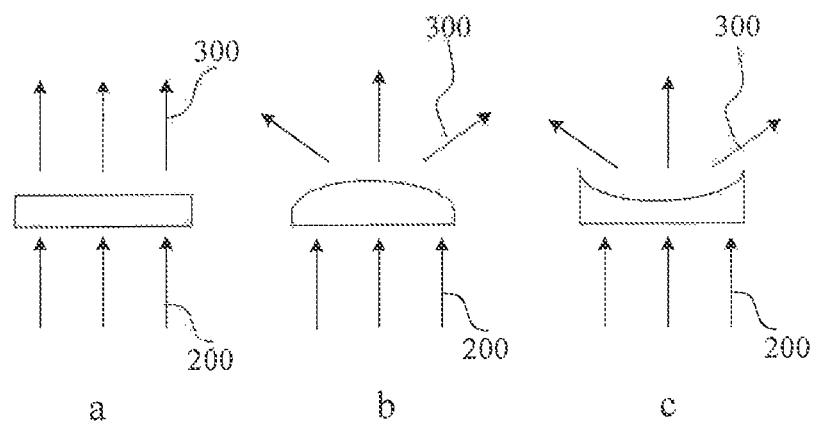
FIG. 3 is a schematic plan structural view showing pixel electrodes of the array substrate provided by the embodiment of the present disclosure.

As shown in FIG. 3, schematic views respectively showing light passes through a planar surface, a convex surface, and a concave surface is provided. As shown in FIG. 3a, after incident light 200 passes through a planar surface, emitted light 300 is still straightly emitted. As shown in FIG. 3b, after incident light 200 passes through a convex surface, emitted light 300 is emitted toward two sides. As shown in FIG. 3c, after incident light 200 passes through a concave surface, emitted light 300 is also emitted toward two sides. As a result, both the convex light-emitting surface 1131 and the concave light-emitting surface 1131 can increase viewing angles.

Figure 4:
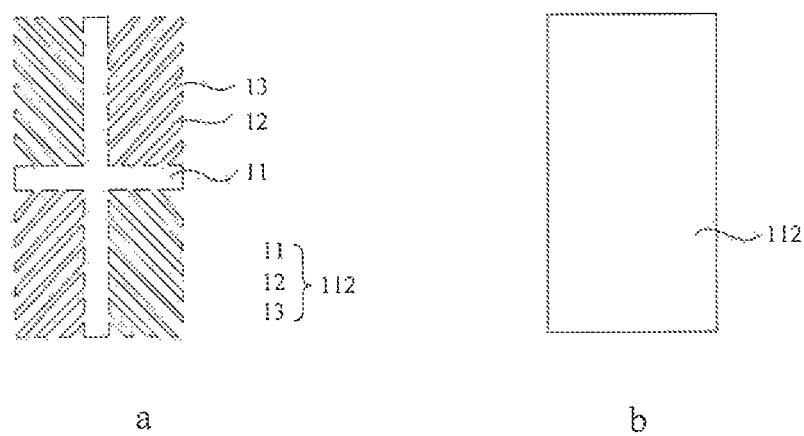
FIG. 4 is a schematic view showing a situation when light passes through a planar surface, a convex surface, and a concave surface.

In the present embodiment, the pixel electrodes 112 may have a planar structure or a slit structure. FIG. 4 is a schematic plan view showing the above two structures. As shown in FIG. 4a, the pixel electrodes 112 have a slit structure. Take a four-domain pixel electrode 112 as an example, it includes a plurality of trunk sections 11 and a plurality of branch sections 12. Each of the trunk sections 11 has a crossing structure that divides each of the pixel electrodes 112 into four domains. Each of the domains has the plurality of branch sections 12 connected to the trunk section 11 and forms a certain angle with respect to the trunk section 11, and a slit 13 is defined between adjacent branch sections 12. In the present embodiment, the pixel electrodes 112 have a four-domain structure, but are not limited thereto. The pixel electrodes 112 may also have an eight-domain structure or other multi-domain structures.

The slit 13 may effectively control an arrangement of liquid crystal molecules, thereby increasing viewing angles. Better viewing angles may be achieved by the pixel electrodes 112 with a slit structure combined with the astigmatism components 113.

As shown in FIG. 4b, the pixel electrodes 112 have a planar structure. Since the astigmatism components 113 have already increased viewing angles, there is no slit provided in each of the pixel electrodes 112. Therefore, a difficulty in adjusting widths of wide lines and narrow wires can be reduced, and a yield rate can be improved.

In the present embodiment, the light-emitting surface 1131 is convex or concave. Therefore, incident light is refracted at the light-emitting surface 1131, so that a light-transmitting direction is altered, and light-emitting angels and viewing angles are increased. By adjusting a curvature of the astigmatism layer, viewing angles can be improved, and panels with different sizes can achieve their best viewing angles. Therefore, a problem that a viewing angle of large-scale VA-LCD panels is hard to be adjusted is prevented.

In addition, in the present disclosure, viewing angles can be increased without reducing brightness of some/all pixels. As a result, compared with conventional technologies (increasing viewing angles by sacrificing light transmittance), a technical solution provided by the present disclosure can improve viewing angles and keep light transmittance unchanged at the same time.

Figure 5:
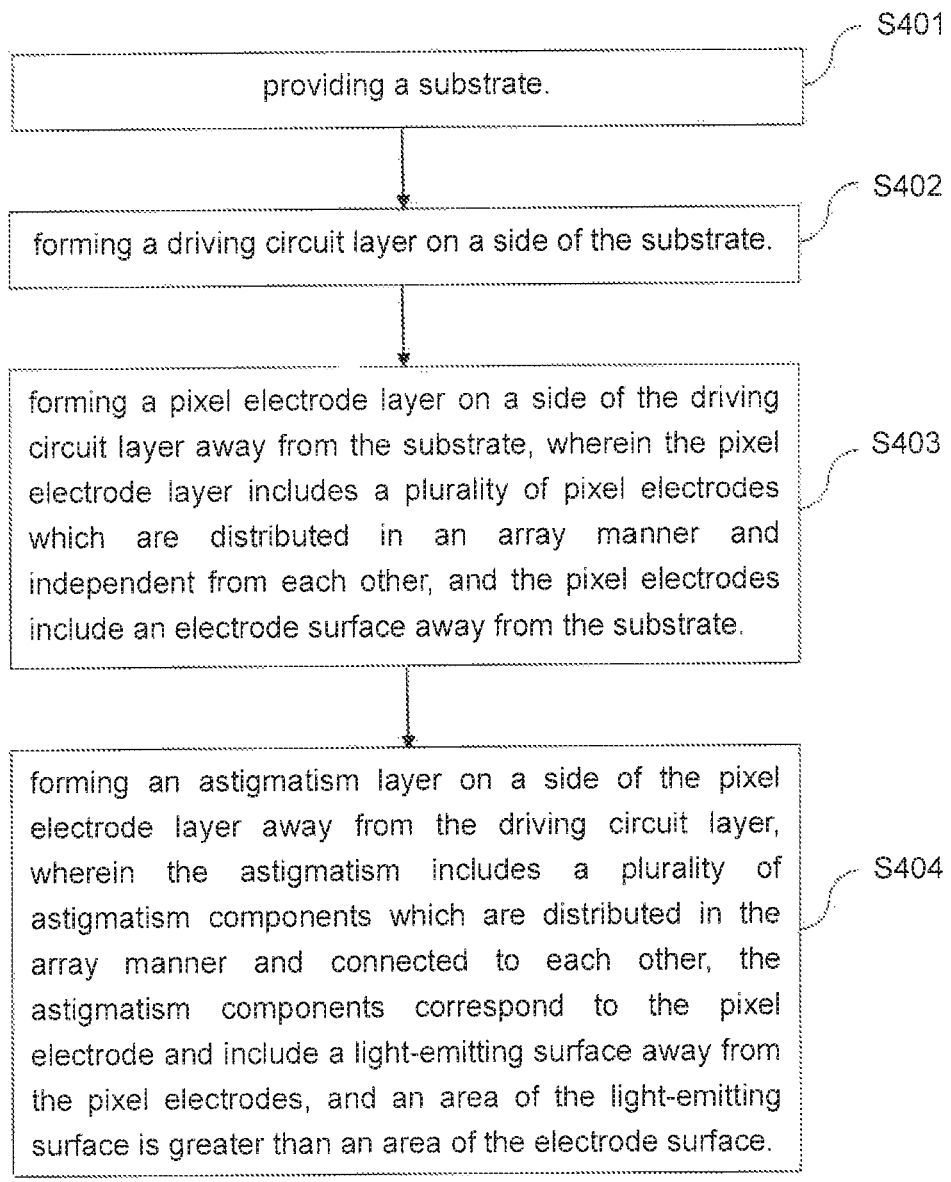
FIG. 5 is a schematic flowchart showing a method of manufacturing an array substrate provided by an embodiment of the present disclosure.

As shown in FIG. 5, the present disclosure further provides a method of manufacturing an array substrate, including following steps:

S401: providing a substrate;

S402: forming a driving circuit layer on a side of the substrate;

S403: forming a pixel electrode layer on a side of the driving circuit layer away from the substrate, wherein the pixel electrode layer includes a plurality of pixel electrodes which are distributed in the array manner and independent from each other, and the pixel electrodes include an electrode surface away from the substrate; and S404: forming an astigmatism layer on a side of the pixel electrode layer away from the driving circuit layer, wherein the astigmatism includes a plurality of astigmatism components which are distributed in the array manner and connected to each other, the astigmatism components correspond to the pixel electrode and include a light-emitting surface away from the pixel electrodes, and an area of the light-emitting surface is greater than an area of the electrode surface.

The method will be described below in conjunction with FIGS. 6 to 12.

Figure 6:
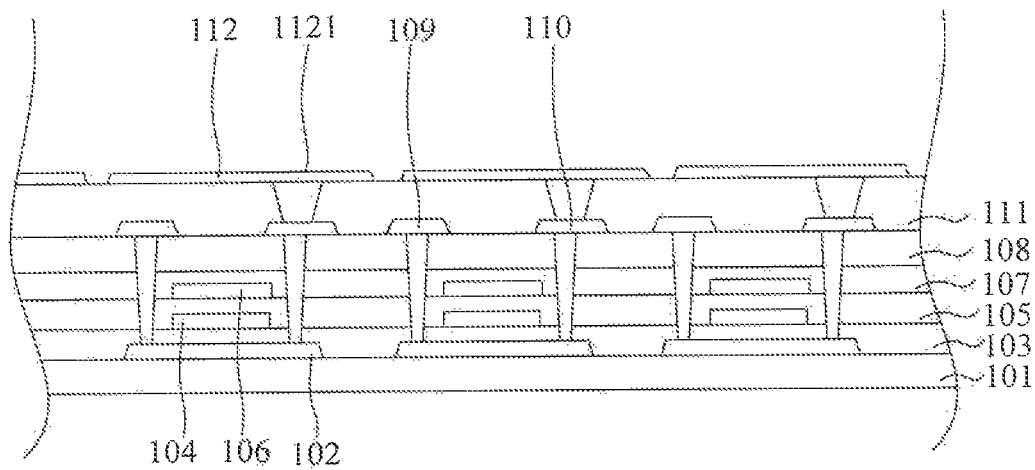
FIG. 6 is a schematic view showing a first stage of the method of manufacturing an array substrate provided by the embodiment of the present disclosure.

S401: providing a substrate. As shown in FIG. 6. The substrate 101 may be a rigid substrate made of glass or a transparent resin, or may be a flexible substrate made of polyimide, polycarbonate, polyethersulfone, polyethylene terephthalate, polyethylene naphthalate, polyacrylates, or glass fiber reinforced plastics. A material of the substrate 101 is not limited here.

S402: forming a driving circuit layer on a side of the substrate. As shown in FIG. 6, the driving circuit layer is disposed on a side of the substrate 101 and includes a plurality of thin film transistors (TFTs). Take a bottom-gate TFT as an example, it includes an active layer 102, a first gate insulating layer 103, a first metal layer 104, a second gate insulating layer 105, a second metal layer 106, an interlayer dielectric layer 107, a planarization layer 108, a source/drain layer, and a passivation layer 111, which are stacked on the substrate 101.

A gate of the TFTs and a first electrode plate of storage capacitors are formed by etching patterns defined on the first metal layer 104. A second electrode plate of the capacitors is formed by etching patterns defined on the second metal layer 106. A source 109 and a drain 110 of the TFTs are formed by etching patterns defined on the source/drain layer. The source 109 and the drain 110 are connected to the active layer by a first through hole.

S403: forming a pixel electrode layer on a side of the driving circuit layer away from the substrate, wherein the pixel electrode layer includes a plurality of pixel electrodes which are distributed in the array manner and independent from each other, and the pixel electrodes include an electrode surface away from the substrate. As shown in FIG. 6, a pixel electrode layer is disposed on the driving circuit layer and includes a plurality of pixel electrodes 112 which are arranged in the array manner and independent from each other, and the pixel electrodes 112 are connected to the drain 110 of the TFTs by a second through hole. The pixel electrodes 112 include an electrode surface 1121 away from the substrate 101, and the electrode surface 1121 is a planar surface.

S404: forming an astigmatism layer on a side of the pixel electrode layer away from the driving circuit layer, wherein the astigmatism layer includes a plurality of astigmatism components which are distributed in the array manner and connected to each other, the astigmatism components correspond to the pixel electrode and include a light-emitting surface away from the pixel electrodes, and an area of the light-emitting surface is greater than an area of the electrode surface. There are multiple ways to make the area of the light-emitting surface of the astigmatism components greater than the area of the electrode surface of the pixel electrodes.

In one embodiment, the S404 includes following steps:

S4041a: coating a positive photoresist on a side of the pixel electrode layer away from the driving circuit layer.

Figure 7:
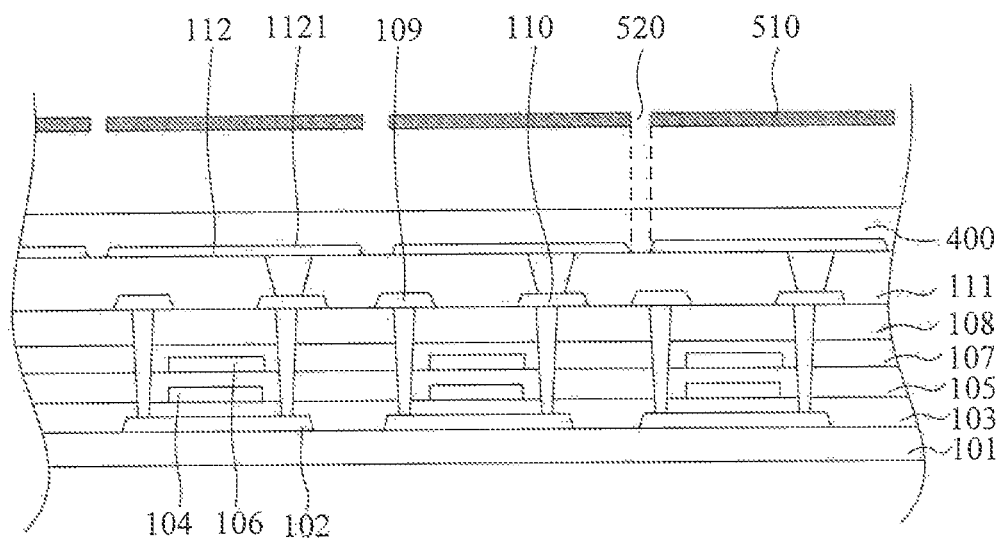
FIG. 7 is a first schematic view showing a second stage of the method of manufacturing an array substrate provided by the embodiment of the present disclosure.

As shown in FIG. 7, a layer of transparent material is coated on the pixel electrode layer. In the present embodiment, the transparent material is a positive photoresist 400.

S4042a: exposing the positive photoresist by using a mask plate, wherein the mask plate includes a light shielding area and a light transmittance area, the light shielding area corresponds to the pixel electrodes, and the light transmittance area corresponds to an area between adjacent pixel electrodes.

As shown in FIG. 7, the positive photoresist 400 is irradiated with ultraviolet (UV) light by using a mask plate. The mask plate includes a light shielding area 510 and a light transmittance area 520. When the mask plate is irradiated with UV light, blocked by the light shielding area 510, UV light can only pass through the light transmittance 520 and be irradiated on the positive photoresist 400 therein. The light shielding area 510 is disposed corresponding to the pixel electrodes 112. Therefore, the positive photoresist 400 covering on the pixel electrodes 112 is not irradiated. The light transmittance area 520 corresponds to an area between adjacent pixel electrodes 112, so that the positive photoresist 400 covering on such area can be irradiated.

S4043a: developing the positive photoresist to remove the positive photoresist corresponding to the light transmittance area.

Figure 8:
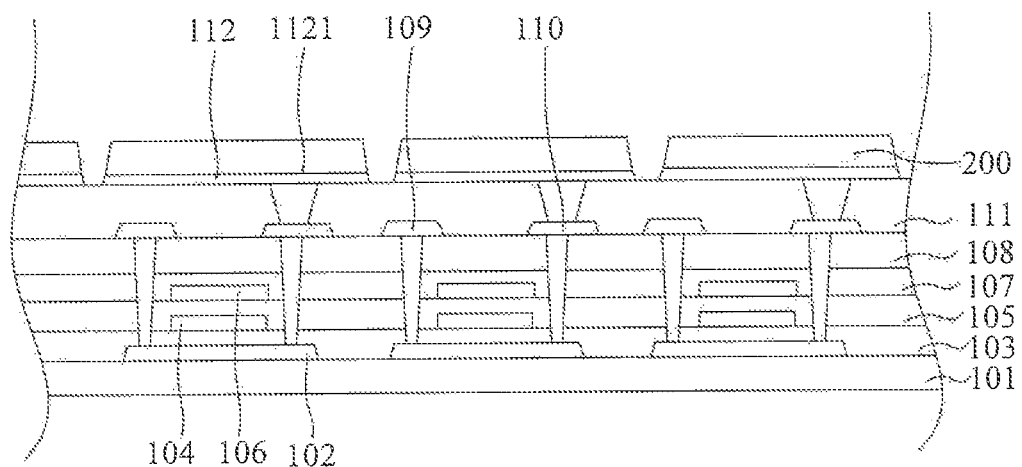
FIG. 8 is a first schematic view showing a third stage of the method of manufacturing an array substrate provided by the embodiment of the present disclosure.

As shown in FIG. 8, after exposure, the mask plate is moved away, and the exposed positive photoresist 400 is developed. The positive photoresist 400, which had been irradiated with UV light, in the light transmittance area 520 is removed, and the positive photoresist 400, which had not been irradiated with UV light, in the light shielding area 510 is retained.

S4044a: heating the positive photoresist to form the plurality of astigmatism components which are distributed in the array manner and connected to each other, wherein the astigmatism components correspond to the pixel electrodes, and the light-emitting surface of the astigmatism components away from the pixel electrodes is convex.

Figure 9:
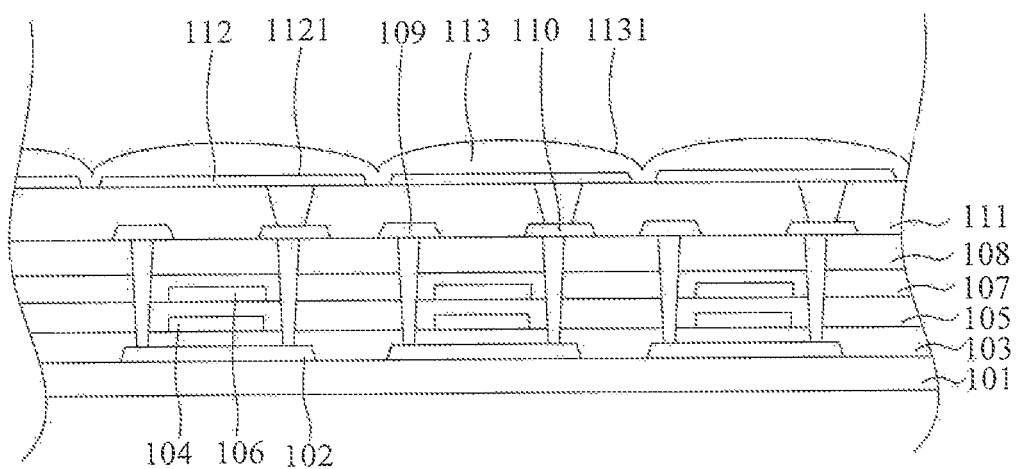
FIG. 9 is a first schematic view showing a fourth stage of the method of manufacturing an array substrate provided by the embodiment of the present disclosure.

As shown in FIG. 9, under conditions of a heating process, a portion of the positive photoresist 400 in the light shielding area 510 may expand to the light transmittance area 520, and ultimately forms the astigmatism components 113 covering the pixel electrodes, which is similar to a convex lens structure. A degree of curvature of a protrusion of the positive photoresist 400 may be decided by adjusting size, distribution, and thickness of the light transmittance area on the mask plate.

The astigmatism components 113 correspond to the pixel electrodes 112. Adjacent astigmatism components 113 are connected to each other. An area where adjacent astigmatism components 113 are connected to each other corresponds to an area (the light transmittance area 520) between adjacent pixel electrodes 112. The plurality of astigmatism components 113 are connected to each other to form the astigmatism layer. The astigmatism components 113 include a light-emitting surface 1131 away from the pixel electrodes 112. After an array substrate and a color filter substrate form an LCD panel bonded to a backlight module, light emitted from the backlight module passes through the pixel electrodes and the astigmatism layer, and exits from the light-emitting surface 1131 of each of the astigmatism components 113.

Incident light emitted from the backlight module is parallel light. An area of the light-emitting surface 1131 of the astigmatism components 113 is greater than an area of the electrode surface 1121 of the pixel electrodes 112, that is, the light-emitting surface 1131 is not a planar surface. Therefore, incident light is refracted in a spreading direction at the light-emitting surface 1131. As a result, a light-emitting angle is increased, and brightness and chromaticity of the panel can be effectively improved wherever it is watched from.

The transparent material used in the present embodiment is a positive photoresist, and the positive photoresist in the light transmittance area 520 is removed after exposure and development. In one embodiment, the transparent material may be a negative photoresist. Meanwhile, in the mask plate as shown in FIG. 7, a position of the light shielding area 510 and a position of the light transmittance area 520 are exchanged. In other words, the light shielding area 510 is changed to be a light transmittance area, and the light transmittance area 520 is changed to be a light shielding area. The negative photoresist, which is not irradiated with UV light, is removed during development. After that, the remaining negative photoresist is heated to form a structure as shown in FIG. 9.

In another embodiment, the S404 further includes following steps:

S4041b: coating a positive photoresist on a side of the pixel electrode layer away from the driving circuit layer.

The S4041b and the S4041a are identical. Specifically, please refer to FIG. 7, a layer of transparent material is coated on the pixel electrode layer. In the present embodiment, the transparent material is a positive photoresist 400.

54042b: exposing the positive photoresist by using a mask plate, wherein the mask plate includes a light shielding area and a light transmittance area, the light transmittance area corresponds to a portion of the pixel electrodes, the portion of the pixel electrodes includes a first area, a second area, and a third area which are independent from each other, the first area corresponds to a middle area of the pixel electrodes, the second area and the third area are respectively disposed at two sides of the first area, and the light shielding area corresponds to another portion of the pixel electrodes and an area between adjacent pixel electrodes.

Figure 10:
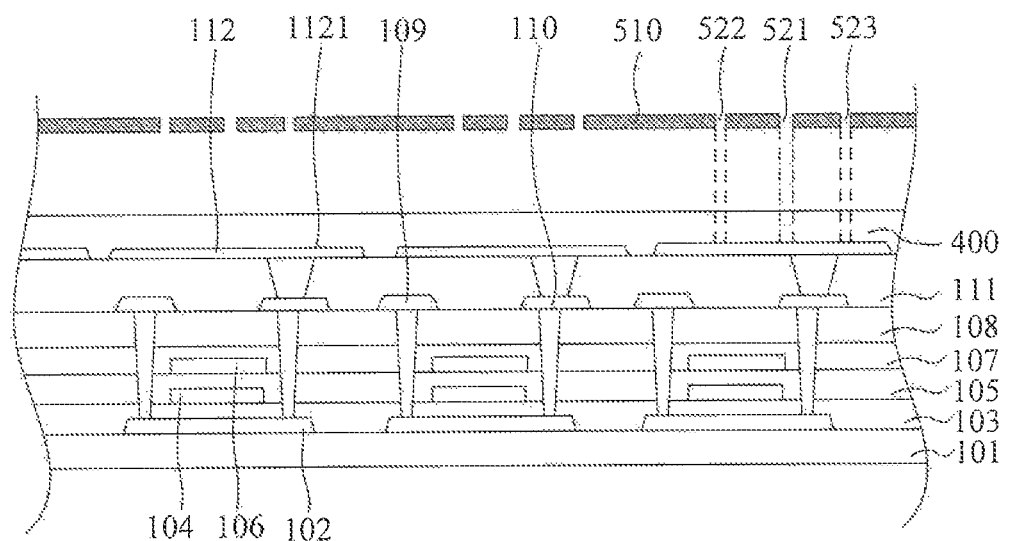
FIG. 10 is a second schematic view showing the second stage of the method of manufacturing an array substrate provided by the embodiment of the present disclosure.

As shown in FIG. 10, the positive photoresist 400 is irradiated with ultraviolet (UV) light by using a mask plate. The mask plate includes a light shielding area 510 and a light transmittance area 520. When the mask plate is irradiated with UV light, blocked by the light shielding area 510, UV light can only pass through the light transmittance area 520 and be irradiated on the positive photoresist 400 therein. The light shielding area 510 is disposed corresponding to the pixel electrodes 112. Therefore, the positive photoresist 400 covering on the pixel electrodes 112 is not irradiated. The light transmittance area 520 corresponds to an area between adjacent pixel electrodes 112, so that the positive photoresist 400 covering on such area can be irradiated.

The light transmittance area 520 corresponds to a portion of the pixel electrodes 112, including a first area 521, a second area 522, and a third area 523. The first area 521 corresponds to a middle portion of the pixel electrodes 112, the second area 522 and the third area 523 are respectively disposed at two sides of the first area 521. The light shielding area 510 corresponds to another portion of the pixel electrodes 112 and an area between adjacent pixel electrodes 112. The positive photoresist 400 in the light shielding area 510 is not irradiated, and the positive photoresist 400 in the light transmittance area 520 is irradiated.

S4043b: developing the positive photoresist to remove the positive photoresist corresponding to the light transmittance area.

Figure 11:
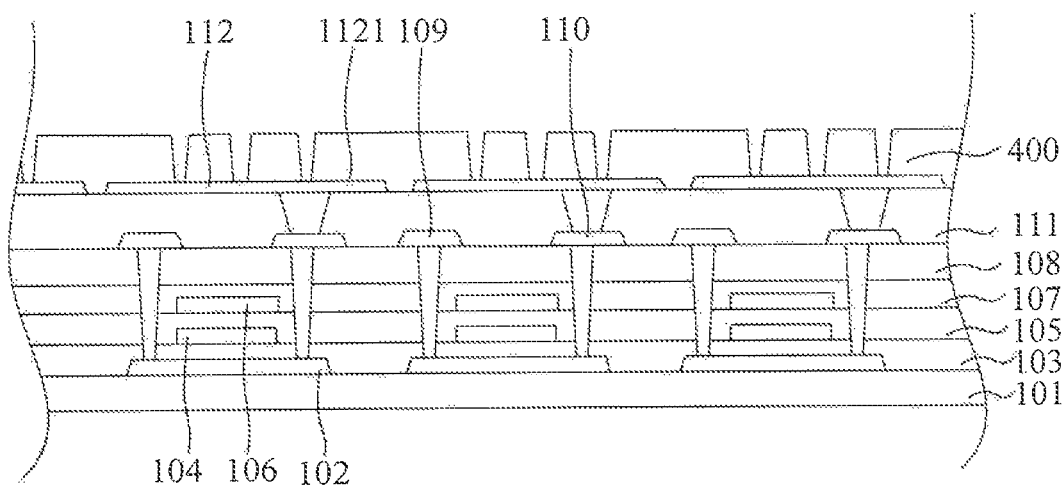
FIG. 11 is a second schematic view showing the third stage of the method of manufacturing an array substrate provided by the embodiment of the present disclosure.

As shown in FIG. 11, after exposure, the mask plate is moved away, and the exposed positive photoresist 400 is developed. The positive photoresist 400, which had been irradiated with UV light, in the light transmittance area 520 is removed, and the positive photoresist 400, which had not been irradiated with UV light, in the light shielding area 510 is retained.

S4044b: heating the positive photoresist to form the plurality of astigmatism components which are distributed in the array manner and connected to each other, wherein the astigmatism components correspond to the pixel electrodes, and the light-emitting surface of the astigmatism components away from the pixel electrodes is convex.

Figure 12:
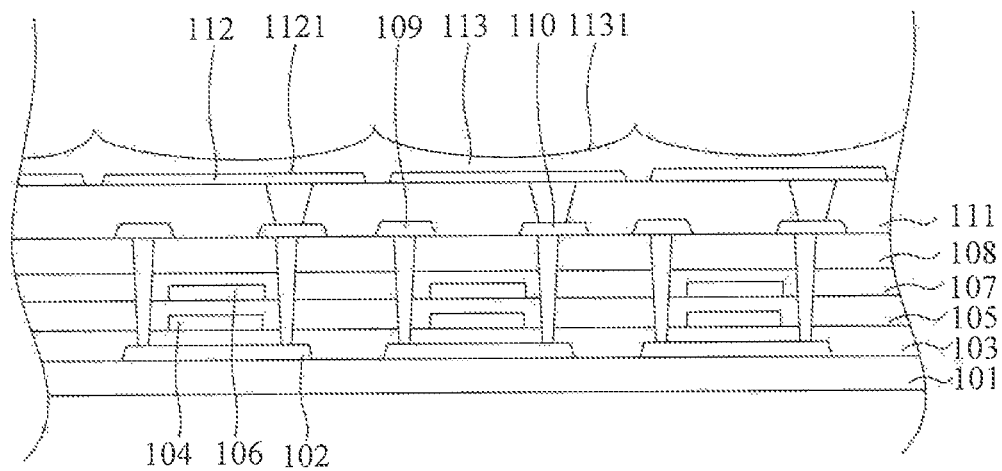
FIG. 12 is a second schematic view showing the fourth stage of the method of manufacturing an array substrate provided by the embodiment of the present disclosure.

As shown in FIG. 12, under conditions of a heating process, a portion of the positive photoresist 400 in the light shielding area 510 may expand to the light transmittance area 520, and ultimately forms the astigmatism components 113 covering the pixel electrodes, which is similar to a convex lens structure. A degree of curvature of a protrusion of the positive photoresist 400 may be decided by adjusting size, distribution, and thickness of the light transmittance area on the mask plate.

The astigmatism components 113 correspond to the pixel electrodes. Adjacent astigmatism components are connected to each other. An area where adjacent astigmatism components 113 are connected to each other corresponds to an area (the light transmittance area 520) between adjacent pixel electrodes 112. The plurality of astigmatism components 113 are connected to each other to form the astigmatism layer. The astigmatism components 113 include a light-emitting surface 1131 away from the pixel electrodes 112. After an array substrate and a color filter substrate form an LCD panel which is bonded to a backlight module, light emitted from the backlight module passes through the pixel electrodes, and the astigmatism layer exits from the light-emitting surface 1131 of each of the astigmatism components 113.

Incident light emitted from the backlight module is parallel light. An area of the light-emitting surface 1131 of the astigmatism components 113 is greater than an area of the electrode surface 1121 of the pixel electrodes 112, that is, the light-emitting surface 1131 is not a planar surface. Therefore, incident light is refracted in a spreading direction at the light-emitting surface 1131. As a result, a light-emitting angle is increased, and brightness and chromaticity of the panel can be effectively improved wherever it is watched from.

In the present embodiment, the transparent material used in the present embodiment is a positive photoresist, and the positive photoresist in the light transmittance area 520 is removed after exposure and development. In one embodiment, the transparent material may be a negative photoresist. Meanwhile, in the mask plate as shown in FIG. 10, a position of the light shielding area 510 and a position of the light transmittance area 520 are exchanged. In other words, the light shielding area 510 is changed to be a light transmittance area, and the light transmittance area 520 is changed to be a light shielding area. The negative photoresist, which is not irradiated with UV light, is removed during development. After that, the remaining negative photoresist is heated to form a structure as shown in FIG. 12.

By using the array substrate formed according to the above manufacturing methods, light emitted from a backlight module will be refracted at light-emitting surface of the astigmatism layer after the LCD panel is formed. As a result, light-emitting angles and viewing angles are increased.

Figure 13:
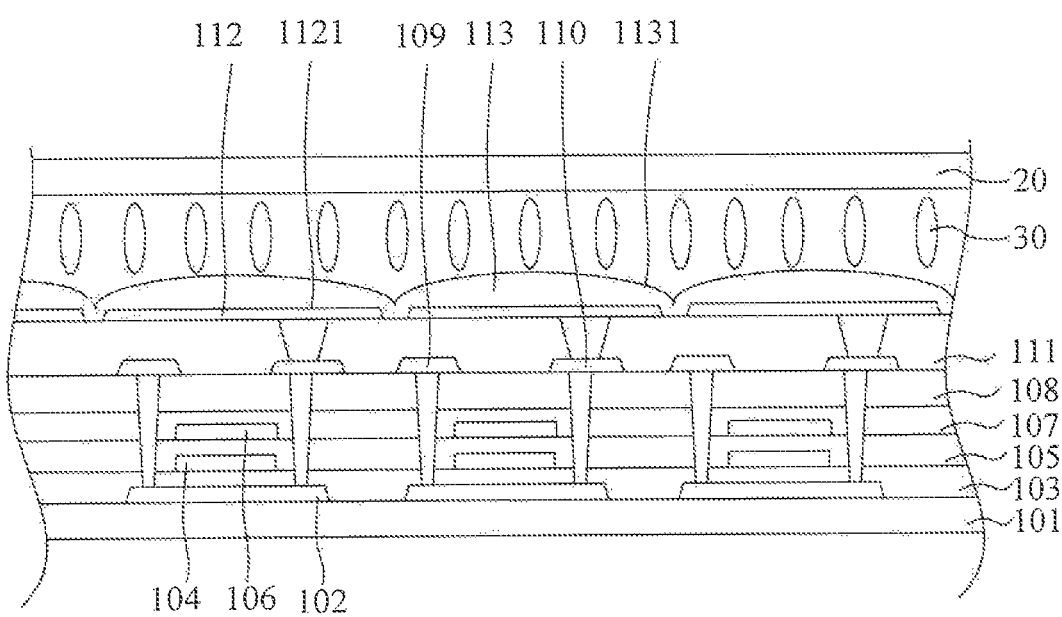
FIG. 13 is a first schematic structural view showing an LCD panel provided by an embodiment of the present disclosure.
Figure 14:
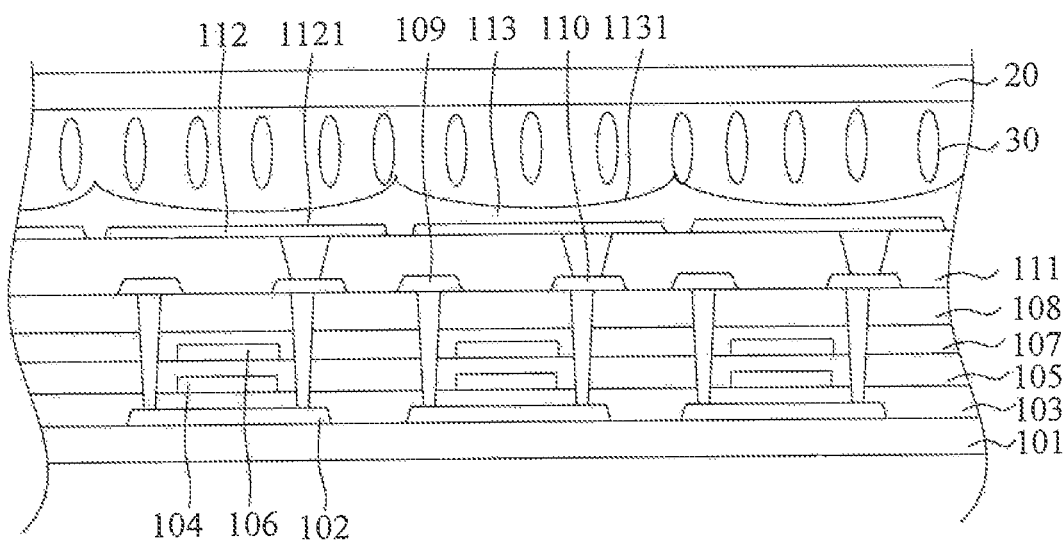
FIG. 14 is a second schematic structural view showing the LCD panel provided by the embodiment of the present disclosure.

As shown in FIG. 13 and FIG. 14, the present disclosure further provides an LCD panel, including a first substrate and a second substrate 20, which form a cell, and a liquid crystal layer 30 disposed between the first substrate and the second substrate 20. The first substrate includes a substrate 101, a driving circuit layer, a pixel electrode layer, and an astigmatism layer. The driving circuit layer is disposed on a side of the substrate 101. The pixel electrode layer is disposed on a side of the driving circuit layer away from the substrate 101 and includes a plurality of pixel electrodes 112 which are distributed in the array manner and independent from each other. The pixel electrodes 112 include an electrode surface 1121 away from the substrate 101. The astigmatism layer is disposed on a side of the pixel electrode layer away from the driving circuit layer and includes a plurality of astigmatism components 113 which are distributed in the array manner and connected to each other. The astigmatism components 113 correspond to the pixel electrodes 112 and include a light-emitting surface 1131 away from the pixel electrodes 112. An area of the light-emitting surface 1131 is greater than an area of the electrode surface 1121.

In the present embodiment, the LCD panel is a VA-LCD panel, the first substrate is an array substrate, and a second substrate is a color filter substrate. In addition, the above technical solutions may also be applied to color filter on array (COA) LCD panels.

The substrate 101 may be a flexible substrate or a rigid substrate. The driving circuit layer is disposed on a side of the substrate 101 and includes a plurality of TFTs. Take a bottom-gate TFT as an example, it includes an active layer 102, a first gate insulating layer 103, a first metal layer 104, a second gate insulating layer 105, a second metal layer 106, an interlayer dielectric layer 107, a planarization layer 108, a source/drain layer, and a passivation layer 111, which are stacked on the substrate 101.

A gate of the TFTs and a first electrode plate of storage capacitors are formed by etching patterns defined on the first metal layer 104. A second electrode plate of the capacitors is formed by etching patterns defined on the second metal layer 106. A source 109 and a drain 110 of the TFTs are formed by etching patterns defined on the source/drain layer. The source 109 and the drain 110 are connected to the active layer 102 by a first through hole.

The pixel electrode layer includes a plurality of pixel electrodes 112 which are disposed in the array manner and independent from each other, and the pixel electrodes 112 are connected to the source 110 of the TFTs by a second through hole. The pixel electrodes 112 include an electrode surface 1121 away from the substrate 101, and the electrode surface 1121 is a planar surface.

An astigmatism layer is disposed on the pixel electrode layer and includes a plurality of astigmatism components 113 which are arranged in the array manner and connected to each other. The astigmatism components 113 correspond to the pixel electrodes 112, adjacent astigmatism components 113 are connected to each other, and locations where the astigmatism components 113 are connected to each other correspond to locations between adjacent the pixel electrodes 112. The astigmatism components 113 include a light-emitting surface 1131 away from the pixel electrodes 112. After an array substrate and a color filter substrate form an LCD panel bonded to a backlight module, light emitted from the backlight module passes through the pixel electrodes and the astigmatism layer exists from the light-emitting surface 1131 of each of the astigmatism components 113.

Incident light emitted from the backlight module is parallel light. An area of the light-emitting surface 1131 of the astigmatism components 113 is greater than an area of the electrode surface 1121 of the pixel electrodes 112, that is, the light-emitting surface 1131 is not a planar surface. Therefore, incident light is refracted in a spreading direction at the light-emitting surface 1131. As a result, a light-emitting angle is increased, and brightness and chromaticity of the panel can be effectively improved wherever it is watched from.

In one embodiment, the passivation layer is made of a transparent material.

In one embodiment, the transparent material is a positive photoresist or a negative photoresist.

In one embodiment, as shown in FIG. 13, the light-emitting surface is convex.

In one embodiment, as shown in FIG. 14, the light-emitting surface is concave.

In one embodiment, the pixel electrodes 112 have a planar structure or a slit structure.

The present disclosure provides an array substrate, a manufacturing method thereof, and an LCD panel. The array substrate includes a substrate, a driving circuit layer, a pixel electrode layer, and an astigmatism layer. The driving circuit layer is disposed on a side of the substrate. The pixel electrode layer is disposed on a side of the driving circuit layer away from the substrate and includes a plurality of pixel electrode, which are distributed in the array manner and independent from each other. The pixel electrodes include an electrode surface away from the substrate. The astigmatism layer is disposed on a side of the pixel electrode layer away from the driving circuit layer and includes a plurality of astigmatism components which are distributed in the array manner and connected to each other. The astigmatism components correspond to the pixel electrodes and include a light-emitting surface away from the pixel electrodes. An area of the light-emitting surface is greater than an area of the electrode surface. By forming the astigmatism layer on the pixel electrodes and making the area of the light-emitting surface of the astigmatism layer greater than the area of the electrode surface of the pixel electrodes, light emitted from a backlight module will be refracted at light-emitting surface of the astigmatism layer after the LCD panel is formed. As a result, light-emitting angles and viewing angles are increased.

In the above embodiments, the focus of each embodiment is different, and for a part that is not detailed in an embodiment, reference may be made to related descriptions of other embodiments.

An array substrate, a manufacturing method thereof, and an LCD panel have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. An array substrate, comprising:
   a substrate;
   a driving circuit layer disposed on a side of the substrate;
   a pixel electrode layer disposed on a side of the driving circuit layer away from the substrate, wherein the pixel electrode layer comprises a plurality of pixel electrodes which are distributed in an array manner and independent from each other, and the pixel electrodes comprise an electrode surface away from the substrate; and
   an astigmatism layer disposed on a side of the pixel electrode layer away from the driving circuit layer, wherein the astigmatism layer comprises a plurality of astigmatism components which are distributed in an array manner and connected to each other, the astigmatism components correspond to the pixel electrodes and comprise a light-emitting surface away from the pixel electrodes, and an area of the light-emitting surface is greater than an area of the electrode surface;
   a surface of a side of the astigmatic layer adjacent to the driving circuit layer is in a contact with the electrode surface of the side of the pixel electrode layer away from the driving circuit layer.

2. The array substrate of claim 1, wherein the astigmatism layer is made of a transparent material.

3. The array substrate of claim 2, wherein the transparent material is a positive photoresist or a negative photoresist.

4. The array substrate of claim 2, wherein the light-emitting surface is convex.

5. The array substrate of claim 2, wherein the light-emitting surface is concave.

6. The array substrate of claim 1, wherein the pixel electrodes have a planar structure or a slit structure.

7. The array substrate of claim 1, wherein the pixel electrodes have a planar surface.

8. The array substrate of claim 1, wherein there is no slit provided in each of the pixel electrodes.

9. A method of manufacturing an array substrate, comprising following steps:
   providing a substrate;
   forming a driving circuit layer on a side of the substrate;
   forming a pixel electrode layer on a side of the driving circuit layer away from the substrate, wherein the pixel electrode layer comprises a plurality of pixel electrodes which are distributed in an array manner and independent from each other, and the pixel electrodes comprise an electrode surface away from the substrate; and
   forming an astigmatism layer on a side of the pixel electrode layer away from the driving circuit layer, wherein the astigmatism layer comprises a plurality of astigmatism components which are distributed in an array manner and connected to each other, the astigmatism components correspond to the pixel electrode and comprise a light-emitting surface away from the pixel electrodes, and an area of the light-emitting surface is greater than an area of the electrode surface
   a surface of a side of the astigmatic layer adjacent to the driving circuit layer is in a contact with the electrode surface of the side of the pixel electrode layer away from the driving circuit layer.

10. The method of claim 9, wherein the step of forming the astigmatism layer on the side of the pixel electrode layer away from the driving circuit layer, wherein the astigmatism layer comprises the plurality of astigmatism components which are distributed in the array manner and connected to each other, the astigmatism components correspond to the pixel electrode and comprise the light-emitting surface away from the pixel electrodes, and the area of the light-emitting surface is greater than the area of the electrode surface, comprises following steps:
    coating a positive photoresist on the side of the pixel electrode layer away from the driving circuit layer;
    exposing the positive photoresist by using a mask plate, wherein the mask plate comprises a light shielding area and a light transmittance area, the light shielding area corresponds to the pixel electrodes, and the light transmittance area corresponds to an area between adjacent pixel electrodes;
    developing the positive photoresist to remove the positive photoresist corresponding to the light transmittance area; and
    heating the positive photoresist to form the plurality of astigmatism components which are distributed in the array manner and connected to each other, wherein the astigmatism components correspond to the pixel electrodes, and the light-emitting surface of the astigmatism components away from the pixel electrodes is convex.

11. The method of claim 9, wherein the step of forming the astigmatism layer on the side of the pixel electrode layer away from the driving circuit layer, wherein the astigmatism layer comprises the plurality of astigmatism components which are distributed in the array manner and connected to each other, the astigmatism components correspond to the pixel electrode and comprise the light-emitting surface away from the pixel electrodes, and the area of the light-emitting surface is greater than the area of the electrode surface, comprises following steps:

coating a positive photoresist on the side of the pixel electrode layer away from the driving circuit layer;

exposing the positive photoresist by using a mask plate, wherein the mask plate comprises a light shielding area and a light transmittance area, the light transmittance area corresponds to a portion of the pixel electrodes, the portion of the pixel electrodes comprises a first area, a second area, and a third area which are independent from each other, the first area corresponds to a middle area of the pixel electrodes, the second area and the third area are respectively disposed at two sides of the first area, and the light shielding area corresponds to another portion of the pixel electrodes and an area between adjacent pixel electrodes;

developing the positive photoresist to remove the positive photoresist corresponding to the light transmittance area; and heating the positive photoresist to form the plurality of astigmatism components which are distributed in the array manner and connected to each other, wherein the astigmatism components correspond to the pixel electrodes, and the light-emitting surface of the astigmatism components away from the pixel electrodes is concave.

12. The method of claim 9, wherein the step of forming the astigmatism layer on the side of the pixel electrode layer away from the driving circuit layer, wherein the astigmatism layer comprises the plurality of astigmatism components which are distributed in the array manner and connected to each other, the astigmatism components correspond to the pixel electrode and comprise the light-emitting surface away from the pixel electrodes, and the area of the light-emitting surface is greater than the area of the electrode surface, comprises following steps:

coating a negative photoresist on the side of the pixel electrode layer away from the driving circuit layer;

exposing the negative photoresist by using a mask plate, wherein the mask plate comprises a light shielding area and a light transmittance area, the light shielding area corresponds to an area between adjacent pixel electrodes, and the light transmittance area corresponds to the pixel electrodes;

developing the negative photoresist to remove the negative photoresist corresponding to the light shielding area; and heating the negative photoresist to form the plurality of astigmatism components which are distributed in the array manner and connected to each other, wherein the astigmatism components correspond to the pixel electrodes, and the light-emitting surface of the astigmatism components away from the pixel electrodes is convex.

13. The method of claim 9, wherein the step of forming the astigmatism layer on the side of the pixel electrode layer away from the driving circuit layer, wherein the astigmatism layer comprises the plurality of astigmatism components which are distributed in the array manner and connected to each other, the astigmatism components correspond to the pixel electrode and comprise the light-emitting surface away from the pixel electrodes, and the area of the light-emitting surface is greater than the area of the electrode surface, comprises following steps:

coating a negative photoresist on the side of the pixel electrode layer away from the driving circuit layer;

exposing the negative photoresist by using a mask plate, wherein the mask plate comprises a light shielding area and a light transmittance area, the light shielding area corresponds to a portion of the pixel electrodes, the portion of the pixel electrodes comprises a first area, a second area, and a third area which are independent from each other, the first area corresponds to a middle area of the pixel electrodes, the second area and the third area are respectively disposed at two sides of the first area, and the light transmittance area corresponds to another portion of the pixel electrodes and an area between adjacent pixel electrodes;

developing the negative photoresist to remove the negative photoresist corresponding to the light shielding area; and heating the negative photoresist to form the plurality of astigmatism components which are distributed in the array manner and connected to each other, wherein the astigmatism components correspond to the pixel electrodes, and the light-emitting surface of the astigmatism components away from the pixel electrodes is concave.

14. The method of claim 9, wherein the step of forming the pixel electrode layer on the side of the driving circuit layer away from the substrate, wherein the pixel electrode layer comprises the plurality of pixel electrodes which are distributed in the array manner and independent from each other, and the pixel electrodes comprise the electrode surface away from the substrate, comprises a following step:

forming the pixel electrode layer on the side of the driving circuit layer away from the substrate, wherein the pixel electrode layer comprises the plurality of pixel electrodes which are distributed in the array manner and independent from each other, and the pixel electrodes have a planar structure or a slit structure.

15. A liquid crystal display (LCD) panel, comprising a first substrate and a second substrate which form a cell, and a liquid crystal layer disposed between the first substrate and a second substrate, wherein the first substrate comprises:

a substrate;

a driving circuit layer disposed on a side of the substrate;

a pixel electrode layer disposed on a side of the driving circuit layer away from the substrate, wherein the pixel electrode layer comprises a plurality of pixel electrodes which are distributed in an array manner and independent from each other, and the pixel electrodes comprise an electrode surface away from the substrate; and an astigmatism layer disposed on a side of the pixel electrode layer away from the driving circuit layer, wherein the astigmatism layer comprises a plurality of astigmatism components which are distributed in an array manner and connected to each other, the astigmatism components correspond to the pixel electrodes and comprise a light-emitting surface away from the pixel electrodes, and an area of the light-emitting surface is greater than an area of the electrode surface a surface of a side of the astigmatic layer adjacent to the driving circuit layer is in a contact with the electrode surface of the side of the pixel electrode layer away from the driving circuit layer.

16. The LCD panel of claim 15, wherein the astigmatism layer is made of a transparent material.

17. The LCD panel of claim 16, wherein the light-emitting surface is convex.

18. The LCD panel of claim 16, wherein the light-emitting surface is concave.

19. The array substrate of claim 15, wherein the pixel electrodes have a planar structure or a slit structure.

20. The LCD panel of claim 15, wherein the pixel electrodes have a planar surface.

\* \* \* \* \*